US011362221B2

(12) United States Patent
Young et al.

(10) Patent No.: US 11,362,221 B2
(45) Date of Patent: Jun. 14, 2022

(54) DOPED PASSIVATED CONTACTS

(71) Applicant: Alliance for Sustainable Energy, LLC, Golden, CO (US)

(72) Inventors: David Levi Young, Golden, CO (US); Pauls Stradins, Golden, CO (US); Benjamin Guocian Lee, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/890,172

(22) Filed: Feb. 6, 2018

(65) Prior Publication Data
US 2018/0226521 A1 Aug. 9, 2018

Related U.S. Application Data

(60) Provisional application No. 62/455,120, filed on Feb. 6, 2017.

(51) Int. Cl.
*H01L 31/044* (2014.01)
*H01L 31/0224* (2006.01)
*H01L 31/0216* (2014.01)
*H01L 31/18* (2006.01)
*H01L 31/068* (2012.01)
*H01L 21/3215* (2006.01)

(52) U.S. Cl.
CPC .............. *H01L 31/022425* (2013.01); *H01L 31/02168* (2013.01); *H01L 31/0682* (2013.01); *H01L 31/1804* (2013.01); *H01L 31/1868* (2013.01); *H01L 21/32155* (2013.01); *Y02P 70/50* (2015.11)

(58) Field of Classification Search
CPC ....... H01L 21/0257–02584; H01L 21/18–187; H01L 21/22–228; H01L 21/24–248; H01L 31/00–078; Y02E 10/50–60
USPC .................................................. 136/243–265
See application file for complete search history.

(56) References Cited

U.S. PATENT DOCUMENTS

| 4,746,964 | A | * | 5/1988 | Aronowitz | ......... H01L 21/2652 257/327 |
| 5,915,196 | A | * | 6/1999 | Mineji | ................ H01L 21/2658 438/526 |
| 8,349,644 | B2 | | 1/2013 | Shan et al. | |
| 2005/0252544 | A1 | | 11/2005 | Rohatgi et al. | |
| 2013/0284248 | A1 | * | 10/2013 | Singh | .................. H01L 31/0682 136/255 |

(Continued)

FOREIGN PATENT DOCUMENTS

WO  WO 2016/049245 A1  3/2016

OTHER PUBLICATIONS

K. Masuko et al. Achievement of More than 25% Conversion Efficiency With Crystalline Silicon Heterojunction Solar cell, IEEE Journal of Photovoltaics, vol. 4, No. 6, Nov. 2014 (Year: 2014).*

(Continued)

*Primary Examiner* — Bach T Dinh
(74) *Attorney, Agent, or Firm* — Sam J. Barkley

(57) ABSTRACT

PolySi:Ga/SiO$_2$ passivated contacts were prepared using ion implantation and dopant inks to introduce Ga into a-Si. Following crystallization anneals these p-type contacts exhibited improved passivation (iVoc of about 730 mV) over B-doped passivated contacts for solar cells.

7 Claims, 14 Drawing Sheets

(56) References Cited

U.S. PATENT DOCUMENTS

2014/0238478 A1* 8/2014 Meier .................. H01L 31/068
              136/256
2016/0268462 A1* 9/2016 Kimoto ............... H01L 31/0747

OTHER PUBLICATIONS

Aguiar, J. et al., "Atomic scale understanding of poly-Si/SiO$_2$/c-Si passivated contacts: passivation degradation due to metallization," IEEE, 2016, pp. 3667-3670.

Crabtree, G. et al., "Production Viability of Gallium Doped Mono-Crystalline Solar Cells," IEEE, 2005, pp. 935-938.

Fair, R., "Physical Models of Boron Diffusion in Ultrathin Gate Oxides," Journal of Electrochemical Society, vol. 144, No. 2, Feb. 1997, pp. 708-717.

Feldmann, F. et al., "Carrier-selective contacts for Si solar cells," Applied Physics Letters, vol. 104, 2014, pp. 181105-1 through 181105-4.

Feldmann, F. et al., "Passivated rear contacts for high-efficiency n-type Si solar cells providing high interface passivation quality and excellent transport characteristics," Solar Energy Materials & Solar Cells, vol. 120, 2014, pp. 270-274.

Fisher, D.J., "Diffusion in Silicon 10 Years of Research," SCITEC Publications, 339 pages.

Fourmond, E. et al., "Electrical properties of boron, phosphorus and gallium co-doped silicon," HAL archives-ouvertes, submitted Jun. 20, 2011, 6 pages.

Francois-Saint-Cyr, H. et al., "Secondary ion mass spectrometry characterization of the diffusion properties of 17 elements implanted into silicon," Journal Vacuum Society Technology B, vol. 19, No. 5, Sep./Oct. 2001, pp. 1769-1774.

Francois-Saint-Cyr, H. et al., "Diffusion of 18 elements implanted into thermally grown SiO$_2$," Journal of Applied Physics, vol. 94, No. 12, Dec. 2003, pp. 7433-7439.

Glunz, S.W. et al., "Comparison of Boron- and Gallium-doped p-Type Czochralski Silicon for Photovoltaic Application," Progress in Photovoltaics: Research and Applications, vol. 7, 1999, pp. 463-469.

Glunz, S.W. et al., "The Irresistible Charm of a Simple Current Flow Pattern—25% With a Solar Cell Featuring a Full-Area Back Contact," presented at the 31st European Photovoltaic Solar Energy Conference and Exhibition, Sep. 2015, Hamburg, 5 pages.

Green, M. et al., "Solar cell efficiency tables (version 48)," Progress in Photovoltaics: Research and Applications; vol. 24, 2016, pp. 905-913.

Jones, S., "Diffusion in Silicon," ICKnowledge LLC, Copyright 2000, 71 pages.

Lin, C.M et al., "Electrical Properties of Ga-Implanted Si p+ -n Shallow Junctions Fabricated by Low-Temperature Rapid Thermal Annealing," IEEE Electron Device Letters, vol. 9, No. 11, Nov. 1988, pp. 594-597.

Linnebach, R.N., "Anomaly in the Ga-Si phase diagram: Nonretrograde solubility of Ga in Si layers grown by liquid-phase epitaxy," Journal of Applied Physics, vol. 67, No. 11, Jun. 1, 1990, pp. 6794-6797.

Nemeth, B. et al., "Polycrystalline silicon passivated tunneling contacts for high efficiency silicon solar cells," Journal of Materials Research, vol. 31, No. 6, 2016, pp. 671-681.

Ou, S. et al., "Growth and etching characteristics of gallium oxide thin films by pulsed laser deposition," Materials Chemistry and Physics, vol. 133, 2012, pp. 700-705.

Passlack, M. et al., "Ga$_2$O$_3$ films for electronic and optoelectronic applications," Journal of Applied Physics, vol. 77, No. 2, Jan. 15, 1995, pp. 686-693.

Reichel, C. et al., "Tunnel oxide passivated contacts formed by ion implantation for applications in silicon solar cells," Journal of Applied Physics, vol. 118, 2015, pp. 205701-1 through 205701-9.

Ren, F. et al., "Wet Chemical and Plasma Etching of Ga$_2$O$_3$(Gd$_2$O$_p$)," Journal of the Electrochemical Society, vol. 144, No. 9, Sep. 1997, pp. 239-241.

Römer, U. et al., "Ion Implantation for Poly-Si Passivated Back-Junction Back-Contacted Solar Cells," IEEE Journal of Photovoltaics, vol. 5, No. 2, Mar. 2015, pp. 507-514.

Salman, F. et al., "Redistribution of implanted species in polycrystalline silicon films on silicon substrate," Defect and Diffusion Forum, www.scientific.net, vol. 264, 2007, accessed online Mar. 27, 2018, pp. 7-12.

Scardera, G. et al., "All-screen-printed dopant paste interdigitated back contact solar cell," Energy Procedia, vol. 77, 2015, pp. 271-278.

Stuwe, D. et al., "Inkjet-Printed Diffusion Sources," presented at the 29th European PV Solar Energy Conference and Exhibition, Sep. 22-26, 2014, Amsterdam (NL), 4 pages.

Yang, G. et al., "Design and application of ion-implanted polySi passivating contacts for interdigitated back contact c-Si solar cells," Applied Physics Letters, vol. 108, 2016, pp. 033903-1 through 033903-4.

Young, D. et al., "Interdigitated Back Passivated Contact (IBPC) Solar Cells Formed by Ion Implantation," IEEE Journal of Photovoltaics, vol. 6, No. 1, Jan. 2016, pp. 41-47.

Young, D. et al., "Low-cost plasma immersion ion implantation doping for Interdigitated back passivated contact (IBPC) solar cells," Solar Energy Materials & Solar Cells, vol. 158, 2016, pp. 68-76.

\* cited by examiner

DOPED PASSIVATED CONTACTS

CROSS-REFERENCE TO RELATED APPLICATION

This application claims priority from U.S. Provisional Application No. 62/455,120, filed Feb. 6, 2017, the disclosure of which is incorporated herein by reference in its entirety.

CONTRACTUAL ORIGIN

The United States Government has rights in this invention under Contract No. DEAC36-08GO28308 between the United States Department of Energy and the Alliance for Sustainable Energy, LLC, the Manager and Operator of the National Renewable Energy Laboratory.

BACKGROUND

PolySi/SiO$_2$ passivated contacts to n-type Si solar cells have been shown to be of excellent quality and have allowed 1-sun efficiencies above 25%. There are several routes to forming these contacts involving a variety of growth and annealing steps, one variation incorporates and preserves a thin tunnelling SiO$_2$ layer between the polycrystalline silicon (polySi) and the crystalline silicon (c-Si) wafer. The n-type (polySi:P) version of this contact is known to produce excellent passivation with implied open circuit voltage (iV$_{oc}$) values of about 740 mV and saturation current density (J$_{oe}$) values less than 9 fA/cm$^2$. However, the p-type (polySi:B) contact has been limited to lower iV$_{oc}$ values closer to about 700 mV (J$_{oe}$<20 fA/cm$^2$). These lower passivation values have been attributed to the low diffusivity of B in SiO$_2$ due to peroxy linkage defects (PLD). PLDs act as a low-energy bridge for B to diffuse through the SiO$_2$ layer, but pileup of B at the SiO$_2$ tunneling layer is observed along with increased H concentrations associated with defect passivation. Accordingly, it would be advantageous to provide p-type polySi/SiO$_2$ passivated contacts having improved characteristics.

SUMMARY

Exemplary embodiments of the invention provide doped polySi/SiO$_2$ passivated contacts and methods of making the same. The contacts may be doped with any suitable material, such as Ga, B, or P. The contacts may be doped p-type or n-type. The dopant may be incorporated by any suitable method, such as ion implantation or spin-on doping.

In an aspect, a method for fabricating gallium doped passivated contacts in a photovoltaic solar cell is disclosed, the method comprises the steps of: providing a silicon substrate wherein the substrate is doped using ion implantation of gallium or spin-on dopant inks containing gallium; and wherein the doped substrate is annealed and passivated; and wherein the passivated contacts have iVoc values of from about 720 to about 732 mV. In an embodiment, the passivated contacts also exhibit Joe values of from about 8.2 to about 3.1 fA/cm$^2$. In an embodiment, the passivated contacts are passivated with Al$_2$O$_3$. In another embodiment, the passivated contacts do not have pileup of gallium at a SiO$_2$ interface of the silicon substrate. In an embodiment, the passivated contacts have fewer dopant-related defects in the SiO$_2$ interface when compared to contacts made with a boron dopant. In another embodiment, the annealing is performed at a temperature between about 850° C. and 950° C.

In an aspect, a photovoltaic solar cell comprising a silicon substrate comprising gallium doped passivated contacts is disclosed wherein the passivated contacts have iVoc values of from about 720 to about 732 mV. In an embodiment, the passivated contacts exhibit Joe values of from about 8.2 to about 3.1 fA/cm$^2$. In an embodiment, the passivated contacts are passivated with Al$_2$O$_3$. In an embodiment, the passivated contacts do not have pileup of gallium at a SiO$_2$ interface of the silicon substrate. In an embodiment, the passivated contacts have fewer dopant-related defects in the SiO$_2$ interface when compared to contacts made with a boron dopant. In an embodiment, the silicon substrate is a crystalline silicon. In an embodiment, the silicon substrate is an n-type doped silicon. In an embodiment, the silicon substrate is a p-type doped silicon. In an embodiment, the silicon substrate is a monocrystalline silicon. In an embodiment, the silicon substrate is a multicrystalline silicon. In an embodiment, the solar cell exhibits efficiency greater than at least 20%.

Other objects, advantages, and novel features of the present invention will become apparent from the following detailed description of the invention when considered in conjunction with the accompanying drawings.

DETAILED DESCRIPTION

Figure 1A:
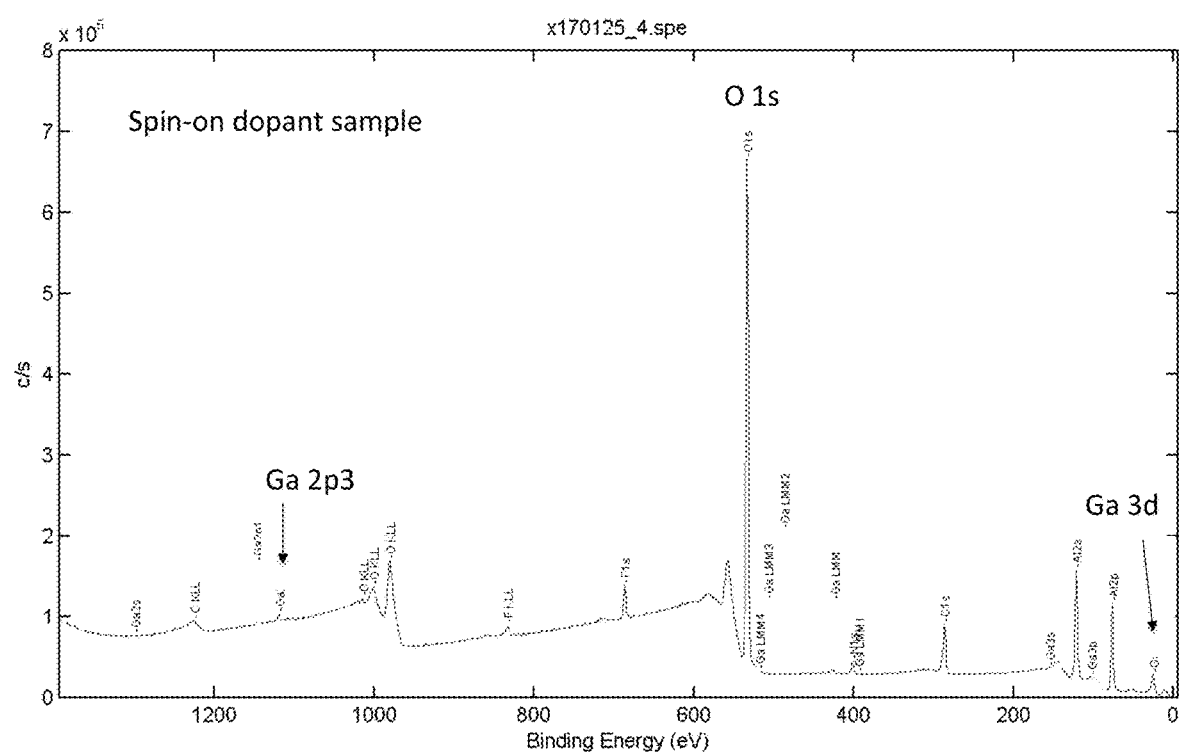
FIG. 1A depicts a surface X-ray Photoelectron Spectroscopy (XPS) elemental surveys for a spin-on dopant sample.

In some embodiments, disclosed herein are doped polySi/SiO$_2$ passivated contacts which may be used in interdigitated back passivated contact (IBPC) solar cells. Disclosed herein are compositions and methods for overcoming the passivation limitation of the polySi:B/SiO$_2$ contact by using Ga as the p-type dopant in the polySi:Ga/SiO$_2$ contact.

In some embodiments, using Ga as a p-type dopant in polySi/SiO$_2$ tunneling contacts overcomes the limitations of B-doped contacts. Gallium's low solid solubility limit in Si increases contact resistivity values but can be overcome with RTA processing. Gallium's fast diffusion in Si and tendency to exhibit retrograde diffusion can be used to form uniformly doped layers in polySi, but must be controlled through time-temperature product anneals to determine both the contact's passivation (dopant profiles into the c-Si wafer) and the surface doping density. The effusion of Ga from the Si wafer's surface is controlled through a dopant-blocking oxide capping layer. The high segregation coefficient of Ga in c-Si is about the same in polySi and is useful for the passivation of a polySi:Ga/SiO$_2$ contact.

The annealing experiments disclosed herein reveal that tuning the time-temperature annealing window results in well-passivated and low contact resistance samples. The annealing parameters for P- and B-doped contacts (850° C., 30 min) form good passivation for the Ga-doped samples, but do not activate enough dopants in the polySi to allow low contact resistivities. However, using higher temperatures for shorter times (950° C., 1 min) does result in contact to the polySi and formation of a diode, but at the expense of higher $J_o$ values compared with the lower temperature anneals.

Without being bound by theory, the metal to polySi contact resistivity currently limits the use of polySi:Ga contacts in solar cells. Despite this doping problem, disclosed herein are methods to form well-behaved diodes with nA/cm$^2$ $J_o$ values and ideality factors of about 1.3, while maintaining a high level of passivation (iVoc).

In an embodiment, the Ga-doped passivated contacts disclosed herein exhibit iVoc values of greater than 730 mV for p-type polySi/SiO$_2$ contacts.

Symmetric test samples were formed using 1-10 Ohm-cm saw-damage-removal etched n-Cz wafers. The wafers were RCA-cleaned before a 1.5 nm thermal tunneling oxide was grown. Next, a PECVD-grown 50 nm intrinsic a-Si layer was deposited over the oxide on both sides of the wafer. The wafers were then either ion implanted with Ga$^{69}$ into the a-Si using a beam line tool or doped with a Ga-containing spin-on dopant ink. The implant doses and energies are shown in Table 1.

TABLE 1

Sample process and passivation parameters

| Material, sample label | Dose (cm$^{-2}$) | Implant Energy, (KeV), dopant | Anneal | iVoc (mV) | 2Jo (fA/cm2) | iFF (%) | Rsheet (Ohms/sq) | Tau-Bulk, (ms) |
|---|---|---|---|---|---|---|---|---|
| PECVD Ga1 | 2.50E+14 | 10, Ga | 850° C., 30 mins | 720 | 8.2 | 82.2 | 356 | 3.1 |
| PECVD Ga2 | 4.00E+14 | 10, Ga | 850° C., 30 mins | 728 | 3.7 | 82 | 400 | 3.3 |
| PECVD Ga3 | 1.00E+15 | 10, Ga | 850° C., 30 mins | 725 | 3.8 | 81.5 | 358 | 2.7 |
| PECVD Ga4_2 | 1.50E+15 | 10, Ga | 850° C., 30 mins | 712 | 7.1 | 73 | 403 | 1.4 |
| PECVD Ga4_3 | 1.50E+15 | 10, Ga | 850° C., 30 mins | 720 | 2.8 | 72 | 399 | 1.3 |
| PECVD Ga4_4 | 1.50E+15 | 10, Ga | 950° C., 1 min | 716 | 0.96 | 71 | 367 | 1 |
| PECVD Ga4_9 | 1.50E+15 | 10, Ga | 950° C., 1 min | 710 | 4.4 | 81 | 386 | 1.1 |
| PECVD Ga4_6 | 1.50E+15 | 10, Ga | 850° C., 30 mins + 950° C., 1 min | 721 | 3.1 | 81 | 361 | 1.6 |
| PECVD Ga4_5 | 1.50E+15 | 10, Ga | 850° C., 10 sec | 647 | 29 | 77 | 406 | 0.2 |
| PECVD Ga4_7 | 1.50E+15 | 10, Ga | 850° C., 30 sec | 633 | 54 | 78 | 379 | 0.1 |
| PECVD Ga4_8 | 1.50E+15 | 10, Ga | 850° C., 1 min | 663 | 14 | 77 | 407 | 0.3 |
| PECVD Ga4_11 | 1.50E+15 | 10, Ga | 950° C., 1 min | 617 | 39 | 80 | 393 | 0.07 |
| PECVD Ga spin-on-dopant | Spin-on-dopant | Ga | 850° C., 30 mins | 731 | 3.1 |  | 494 | 3.5 |
| LPCVD M6 | 2.00E+15 | 10, Ga | 850° C., 1 sec | 734 | 1.5 | 69 | 353 | 2.2 |
| LPCVD M7 | 2.00E+15 | 10, Ga | 850° C., 1 sec | 737 | 2.4 | 70 | 343 | 3.4 |
| LPCVD M4 | 2.00E+15 | 10, Ga | 850° C., 1 min | 700 | 6.1 | 75 | 356 | 0.724 |
| LPCVD M5 | 2.00E+15 | 10, Ga | 850° C., 1 min | 673 | 7.4 | 76 | 341 | 0.331 |
| LPCVD M12 | 2.00E+15 | 10, Ga | 950° C., 1 min | 712 | 6 | 80 | 363 | 1.3 |
| PECVD A1 | 4.00E+15 | 5, B | 850° C., 30 mins | 696 | 37 | — | 243 | 7.8 |
| PECVD A15 | 3.00E+15 | 4, B2HS | 850° C., 30 mins | 692 | 41 | — | 234 | 2.7 |
| PECVD | — | In situ B doping | 850° C., 30 mins | 715 | 16.5 | 83.0 | 283 | 6.5 |

Implanted and in situ-doped B samples are also include in Table 1 for reference. The samples were then annealed in a clean tube furnace between about 850° C.-950° C. for 1 sec to 30 mins to crystallize the a-Si to polySi, and to diffuse and activate dopants. For the ink-doped samples, the glass dopant layer was then removed with HF. Next, a 30 nm layer of Al$_2$O$_3$ was deposited on both sides of the wafer using atomic layer deposition of H$_2$O and trimethalaluminum precursors and then annealed at 400° C. for 20 min in N$_2$ ambient. Lifetime as a function of minority carrier density (MCD) data were collected using a Sinton WCT-120 photoconductance instrument. Dynamic-SIMS depth profiles were performed on select samples using 1.5 keV O$_2^+$ ions. X-ray Photoelectron Spectroscopy (XPS) analysis of the surface of annealed samples was performed to evaluate elemental composition and charge state. Metal/polySi contact resistivity measurements were made using transmission line measurement TLM patterns and emitter diode parameters were measured using small area metal contacts to the polySi:Ga using a Ga/In eutectic back Ohmic contact.

Figure 13:
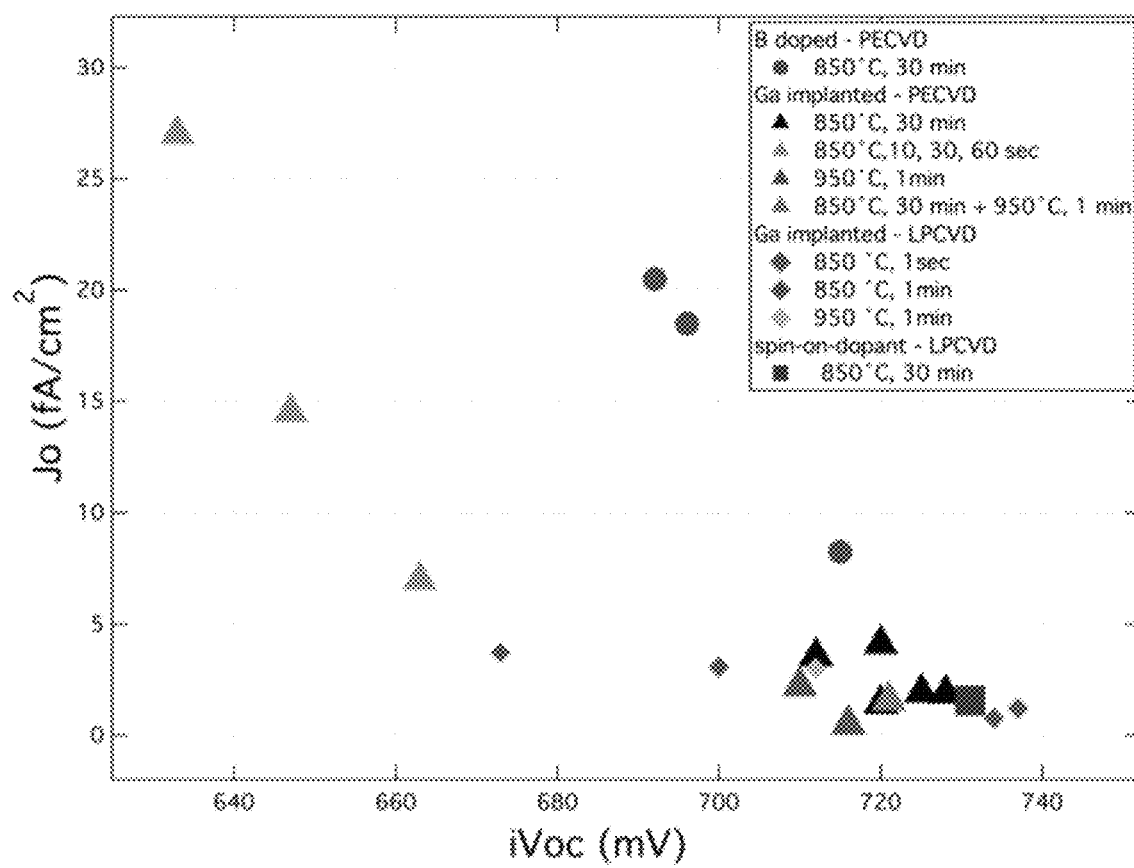
FIG. 13 depicts $J_o$ (fA/cm$^2$) vs. iVOC (mV) for B doped PECVD, Ga implanted PECVD, Ga implanted LPCVD and spin on dopant LPCVD.

PolySi:X/SiO$_2$ passivated contacts were formed on n-Cz wafers using ion implantation of X and X-containing spin-on dopant inks. After annealing and passivation with Al$_2$O$_3$, the contacts exhibit iV$_{oc}$ values of 720-732 mV with corresponding J$_{oe}$ values of 8.2-3.1 fA/cm$^2$. These are among the best-reported values for Z-type polySi/SiO$_2$ contacts. SIMS depth profile data show that, in contrast to Y, X does not pileup at the SiO$_2$ interface in agreement with its known high diffusivity in SiO$_2$. This lack of X pileup may imply fewer dopant-related defects in the SiO$_2$, compared with Y dopants, and account for why the X exhibits excellent passivation. FIG. 13 depicts J$_o$ (fA/cm$^2$) vs. iVOC (mV) for B doped PECVD, Ga implanted PECVD, Ga implanted LPCVD and spin on dopant LPCVD.

Though the diffusivity of Ga in c-Si is slightly lower than for B in c-Si, it is high enough to form uniformly doped layers in 10-100 nm thick polySi by diffusion. Ga has a diffusivity in SiO$_2$ 2-orders of magnitude higher compared to B and a much higher segregation coefficient ([Ga]Si:[Ga] SiO$_2$). Comparatively, the result is that Ga does not pileup as in SiO$_2$ and doesn't form passivation-killing defects in the SiO$_2$ or contribute to oxide breakup. The solid solubility of Ga in c-Si is low (1E19 cm$^{-3}$ at 800° C.), but this does not inhibit contact or PN junction formation in Ga doped wafers for solar cells or high-quality rectifying diodes.

In an embodiment, formed gallium doped polySi:Ga/SiO$_2$ passivated contacts on n-Cz wafers using ion implantation of Ga and Ga-containing spin-on dopant inks is disclosed. Ga-doped passivated contacts formed according to the methods discussed below exhibit near best-in-class iV$_{oc}$ values (>730 mV) for p-type polySi/SiO$_2$ contacts. After annealing and passivation with Al$_2$O$_3$, the contacts exhibit iVoc values of 720-732 mV with corresponding J$_{oe}$ values of 8.2-3.1 fA/cm$^2$. SIMS depth profile data show that, in contrast to B, Ga does not pileup at the SiO$_2$ interface in agreement with its known high diffusivity in SiO$_2$. This lack of Ga pileup results in fewer dopant-related defects in the SiO$_2$, compared with B dopants, and also results in excellent passivation.

As discussed above, in some examples, symmetric test samples were formed using 1-10 Ohm-cm saw-damage-removed etched n-type Czochralski (n-Cz) Si wafers. The wafers were RCA-cleaned before a 1.5 nm thermal tunneling oxide was grown. Next, a plasma-enhanced chemical vapor deposition (PECVD)-grown 50 nm intrinsic amorphous silicon (a-Si) layer was grown over the oxide on both sides of the wafer. The wafers were then either ion implanted with Ga$^{69}$ into the a-Si using a beam line tool or doped with a Ga-containing spin-on dopant ink. The implant doses and energies are shown in Table 1. The samples were then annealed in a clean tube furnace at 850° C. for 30 mins to crystallize the a-Si to polySi, and to diffuse and activate dopants. For the ink-doped samples the glass dopant layer was removed with HF. Next, a 30 nm layer of Al$_2$O$_3$ was deposited on both sides of the wafer using atomic layer deposition (ALD) and then annealed at 400° C. for 20 mins. Lifetime data as a function of minority carrier density (MCD) data were collected using a Sinton WCT-120 instrument. Secondary Ion Mass Spectrometry (SIMS) depth profiles were performed on select samples. X-ray Photoelectron Spectroscopy (XPS) analysis of the surface of annealed samples was performed to evaluate elemental composition. Finally, cross-sectional electron energy loss spectroscopy imaging compared dopant levels in the tunneling oxide between B-doped and Ga-doped samples. Metal/polySi contact resistivity measurements were made using transmission line method (TLM) patterns.

As discussed above, Table 1 shows calculated iV$_{oc}$, 2J$_{oe}$, implied fill factor (iFF), sheet resistance (R$_{sheet}$), and bulk lifetime (tau_bulk) values from minority carrier lifetime data as a function of MCD for various samples. Implant dose and energy levels are also shown. All of the samples in Table 1 show remarkable passivation parameters with iV$_{oc}$ values between 720-731 mV, and 2J$_{oe}$ values of 8.2 to 3.1 fA/cm$^2$. These iV$_{oc}$ and 2J$_{oe}$ values are improved over previously known p-type polySi/SiO$_2$ contacts that are not purposefully annealed to break up the tunneling oxide. The iFF values are up to about 82%.

In some examples, metal contacts were formed to the samples by etching off the Al$_2$O$_3$ in HF and evaporating Ag in a TLM pattern. Quantitative photoluminescence data showed only about a 2-3 mV decrease in iV$_{oc}$ after metallization. Ag/polySi:Ga contact resistances for both the implanted and ink-doped samples were high. XPS data depicted in FIGS. 1A and 1B revealed that residual oxides were still present after HF etching for the ink-doped samples and that low Ga concentrations (not detectable) at the contact surface of the implanted samples contributed to the poor contacts.

Figure 1B:
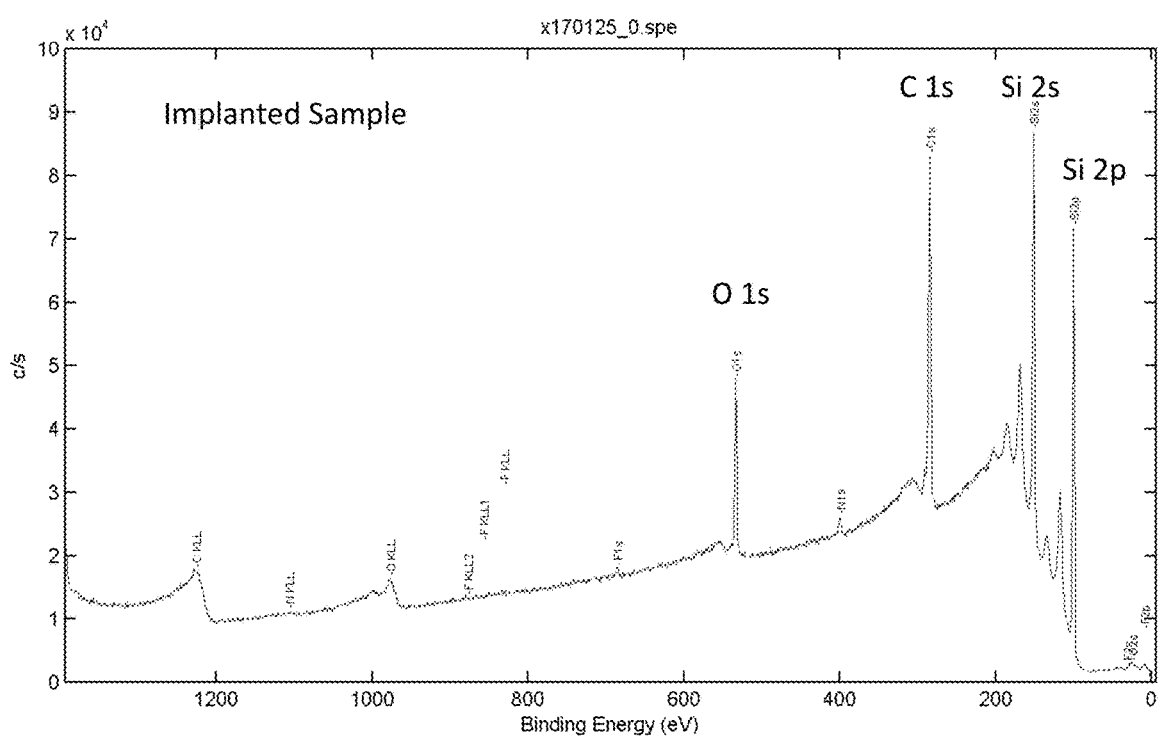
FIG. 1B depicts a surface X-ray Photoelectron Spectroscopy (XPS) elemental surveys for an ion implanted sample.

FIGS. 1A and 1B depict a secondary ion mass spectroscopic (SIMS) elemental depth profile for a polySi:B/SiO$_2$ passivated contact. The profile reveals the pileup of B and H at the SiO$_2$ layer. The chemical passivation quality of the SiO$_2$/c-Si largely determines the overall passivation of the contact structure. Not being limited by theory, simulations of the emitter passivation using EDNA-28 with experimental B depth profile concentrations from the SiO$_2$ layer into the c-Si wafer reveal that the SiO$_2$/c-Si interface dominates the passivation of the polySi/SiO$_2$ contacts.

Figure 2:
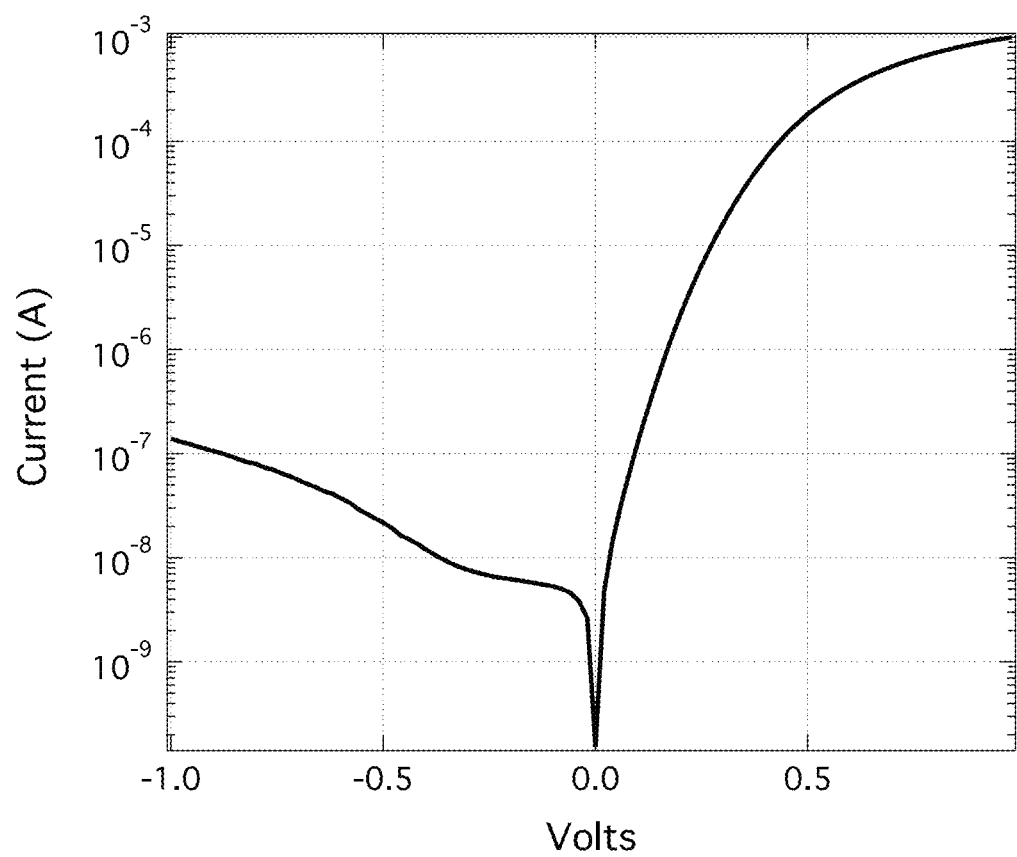
FIG. 2 depicts a current vs. voltage curve for a sample demonstrating PN junction behavior.

FIG. 2 depicts a current vs. voltage curve for an implanted Ag/PolySi sample revealing diode-like behavior when measured between an Ag TLM pad and an Ohmic Ga/In eutectic contact to the n-type wafer. The high series resistance is evident from the non-exponential rollover in high forward bias.

Figures 3A, 3B, 3C:
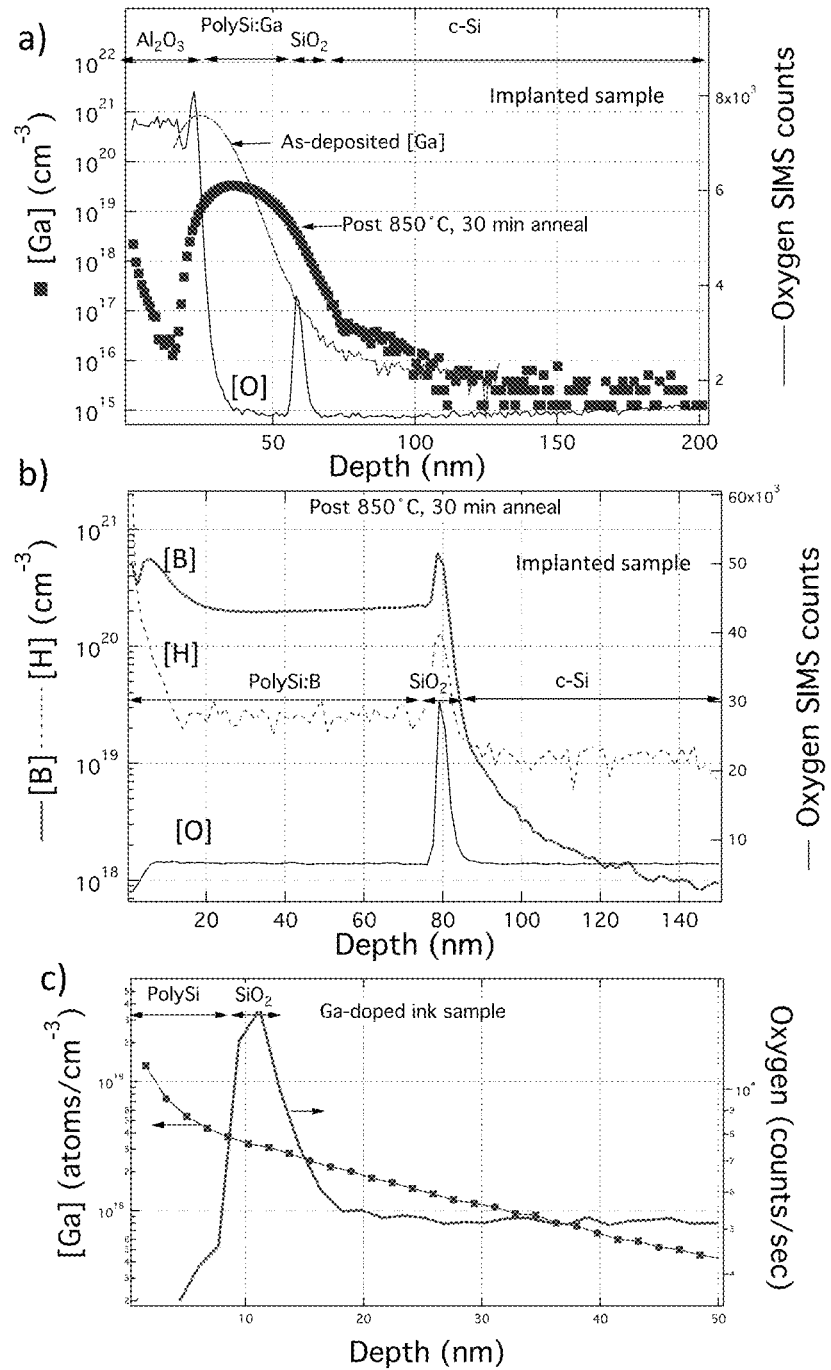
FIGS. 3a, 3b, and 3c depicts SIMS data for polySi/SiO$_2$ samples implanted with Ga and B.

FIG. 3a depicts Ga concentrations as a function of depth in the as-implanted state and after an 850° C. anneal for 30 mins, and after an Al$_2$O$_3$ layer is deposited and annealed at 400° C. for 20 mins. The profiles show that the Ga atoms diffuse both deeper into the wafer (through the tunneling oxide) and towards the surface with this annealing sequence. The Ga atoms do not pile up at the tunneling oxide interface. In contrast, FIG. 3b) shows the depth profile of a polySi:B/SiO$_2$ contact after the same annealing procedure, showing that B does pile up at the oxide interface. The corresponding spike in H (red, dashed line in 3b) at the interface may be associated with hydrogen-capturing defects. This difference between the B-doped and the Ga-doped samples is a reason for the improved passivation qualities of the Ga-doped samples.

FIGS. 3a and 3b depict several differences between the Ga and B concentrations. The peak Ga concentration is about 10× lower in the polySi and about 100× lower at the contacting interface (Al$_2$O$_3$/polySi) and at the passivating interface (SiO$_2$/c-Si) regions. The low Ga concentration at the Al$_2$O$_3$/polySi interface inhibits good Ohmic metal contact, while the lack of carrier pileup in the SiO$_2$/c-Si interface contributes to the improved passivation. Ga exhibits nonretrograde solubility in Si at temperatures below 600° C. At annealing temperatures around 550° C., dopant activation density exceeding the solid solubility limit has been seen in amorphized Si using flash annealing techniques. These properties allow for improved processes using lower temperatures and shorter annealing times. FIG. 3(c) shows Ga profiles for a spin-on ink sample. Compared to the implant sample, similar Ga concentrations exist at the $SiO_2$/c-Si interface, but the surface concentration and dopant profiles differ and corroborate the XPS data of FIG. 1A and FIG. 1B.

Although the embodiments discussed above use Ga as the dopant, any suitable dopant may be used, such as P or B. Also, any suitable method may be used to incorporate the dopant into the wafer. For example, as compared with ion implantation, using spin-on dopants or dopant inks/pastes is a simplified fabrication process and has the potential to reduce costs.

Figure 4:
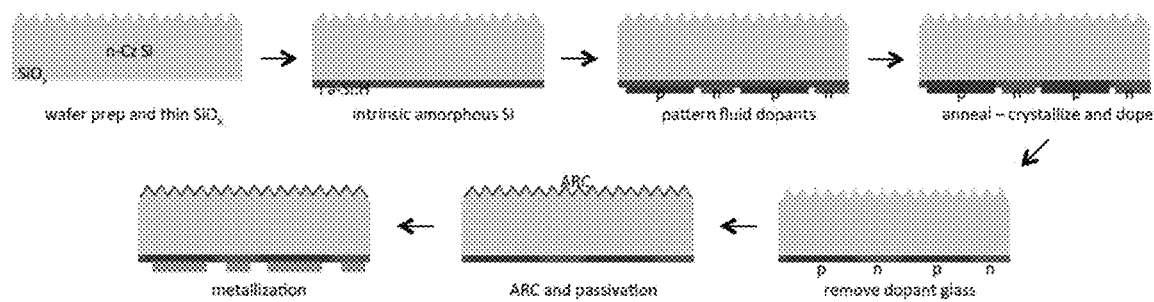
FIG. 4 depicts a flow diagram for the fabrication of IBPC solar cells via spin-on dopant or dopant paste.

In an embodiment, FIG. 4 depicts a method of fabricating IBPC solar cells using a spin-on dopant for p- and n-type passivated contacts according to some exemplary embodiments of the invention. In an embodiment, high-lifetime n-Cz wafers may be used, and processing may begin with wafer cleaning (RCA) and the growth of a 15-20 Å tunneling oxide, either with hot nitric acid or a quick dry oxidation at 700° C. Next, a 50-200 nm layer of intrinsic amorphous Si is grown on the rear side by PECVD, or alternatively intrinsic poly-Si by low pressure chemical vapor deposition (LPCVD).

In another embodiment, commercially-available B, Ga, and P spin-on dopants may be used for p- or n-type doping. The dopant-containing fluids are spin-coated with a thickness of about 400 nm and cured at about 200° C. on a hotplate. Patterning is accomplished by photolithography. In an embodiment, intrinsic regions are left between the doped passivated contacts for isolation.

Dopants are driven into the intrinsic amorphous/poly-Si layer by annealing at about 850° C. in $N_2$ gas. In PECVD-deposited hydrogenated amorphous Si (a-Si:H), this anneal also crystallizes the layer. Then the dopant glass is removed by HF. In an embodiment, fifteen nm $Al_2O_3$ is deposited conformally on the cell surface by ALD for passivation, and about 75 nm $SiN_x$ is deposited on the front side as an antireflection coating. A forming gas anneal (FGA) at about 400° C. is performed to activate the passivation. Finally, devices are metallized with evaporated Al, patterned by photolithography.

Symmetric lifetime test samples are fabricated using a process similar to the cells. A difference is that the poly/amorphous Si is deposited symmetrically on both sides of the Si wafer. In additions, the same dopant (B, Ga, or P) is deposited on both sides. The symmetric lifetime samples are fabricated for either p-type (B or Ga) passivated contacts, or for n-type (P) contacts.

In an embodiment, Sinton lifetime measurements were performed on the samples at key stages of the process: (1) intrinsic poly-Si, (2) after spin-on dopant deposition and anneal, (3) after FGA activation of passivation. Implied $V_{oc}$ at 1-sun illumination was also extracted from the measurements. The resistivity of the passivated contact was found via TLM analysis of fabricated metal contact pads.

Figures 5A, 5B:
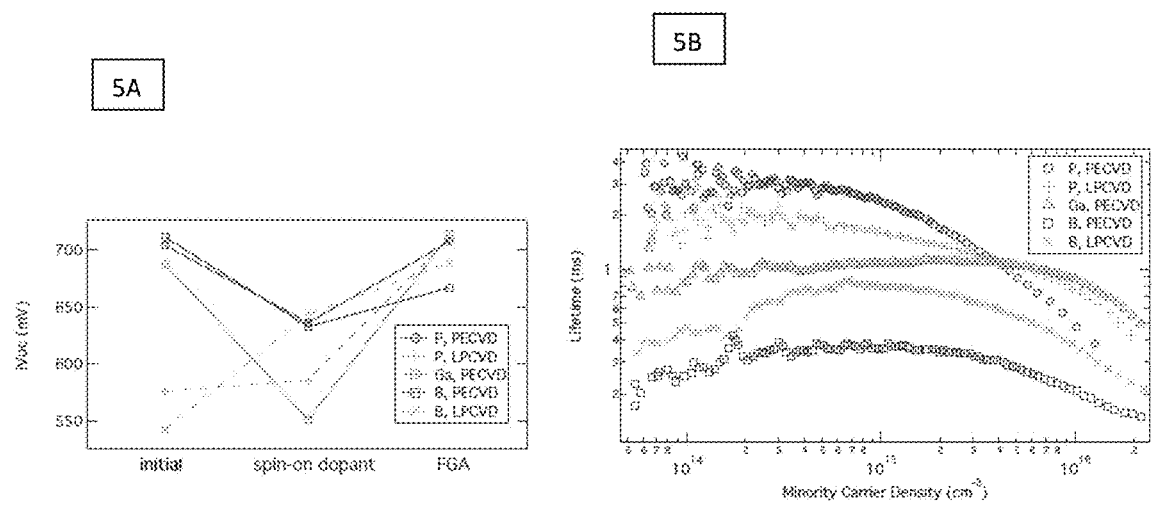
FIGS. 5A and 5B depict measurements for symmetric samples with doped passivated contacts after various processing steps.

The passivation quality of the test samples was determined from the implied $V_{oc}$ after key processing steps: (1) initial intrinsic poly-Si, (2) spin-on dopant deposition and anneal, (3) final device after FGA activation of the passivation. $iV_{oc}$ data for all dopant types and both poly-Si deposition methods (PECVD, LPCVD) are depicted in FIGS. 5A and 5B. There is no correlation between the passivation quality ($iV_{oc}$) at initial, intermediate or final steps. The LPCVD-grown samples start with much lower $iV_{oc}$ than PECVD ones, but end up with approximately the same final results. FIG. 5B depicts a plot of the finished samples' lifetime vs. injection level in the final state after FGA activates the passivation.

The performance of the n-type (P) passivated contact has a final $iV_{oc}$=708 and 710 mV for PECVD and LPCVD poly-Si, respectively. The B p-type passivated contact with LPCVD poly-Si has a final $iV_{oc}$=689 mV.

B-doped passivated contacts with PECVD poly-Si have a comparatively lower final $iV_{oc}$=667 mV. A possible explanation is that B dopant concentration near the tunneling $SiO_x$ interface is too high. The B spin-on glass has high dopant concentration of 8E21 $cm^{-3}$ and the PECVD-grown layer is only 50 nm thick vs. 200 nm for LPCVD. As discussed above, Ga-doped p-type passivated contacts exhibit an improved final $iV_{oc}$.

The resistivity for the P-doped passivated contact is found to be 25-30 $m\Omega \cdot cm^2$ for both PECVD- and LPCVD-grown poly-Si. For B- and Ga-doping, p-type passivated contacts were grown on an n-type wafer. Since this is a p-n diode the TLM analysis is not applicable. Analysis of the diode I-V characteristic of the B passivated contact gives an initial estimate of the effective contact resistivity <50 $m\Omega \cdot cm^2$.

These results demonstrate that passivated contacts fabricated with spin-on dopants exhibit improved performance. Spin-on dopants are useful for IBPC cells with a simple and low-cost process, and high efficiency Si photovoltaics that are industrially viable.

Photoconductance Measurements

Table 1, above, shows implant and annealing conditions along with measured $iV_{oc}$, $2J_{oe}$, iFF, Rsheet, and tau_bulk. Values from minority carrier lifetime data as a function of MCD. Many of the samples in Table 1 have improved passivation parameters with $iV_{oc}$ values as high as 731 mV, and $2J_{oe}$ values less than 4 $fA/cm^2$. These $iV_{oc}$ and $2J_{oe}$ values are improved over p-type polySi/$SiO_2$ contacts that are not purposefully annealed to break up the tunneling oxide. Additionally, for many of the samples, the bulk wafer lifetime remained above 1 ms. The iFF values are at about 82%. FIG. 13 depicts $J_o$ ($fA/cm^2$) vs. iVOC (mV) for B doped PECVD, Ga implanted PECVD, Ga implanted LPCVD and spin on dopant LPCVD.

Annealing and SIMS Depth Profiles

Figure 6:
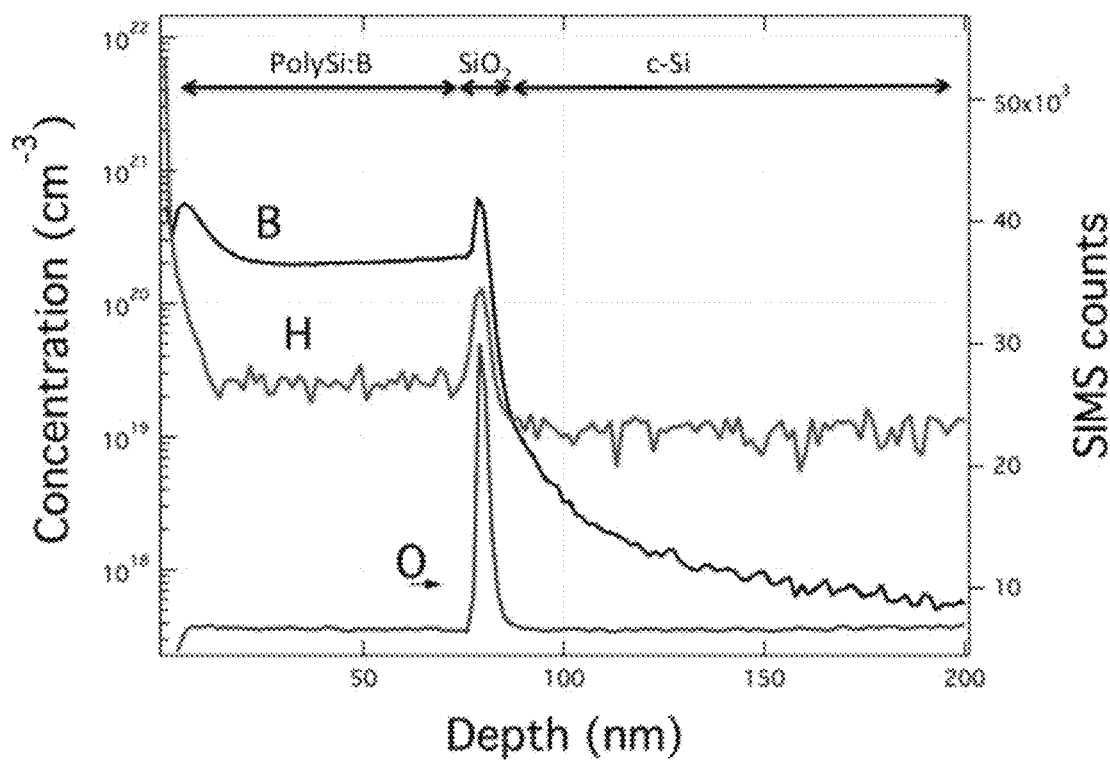
FIG. 6 depicts SIMS depth profile of B, H and O for a polySi:B/SiO$_2$ passivated contact annealed at 850° C. for 30 mins. Note the high B and H concentrations in the thin oxide layer.
Figures 7A, 7B:
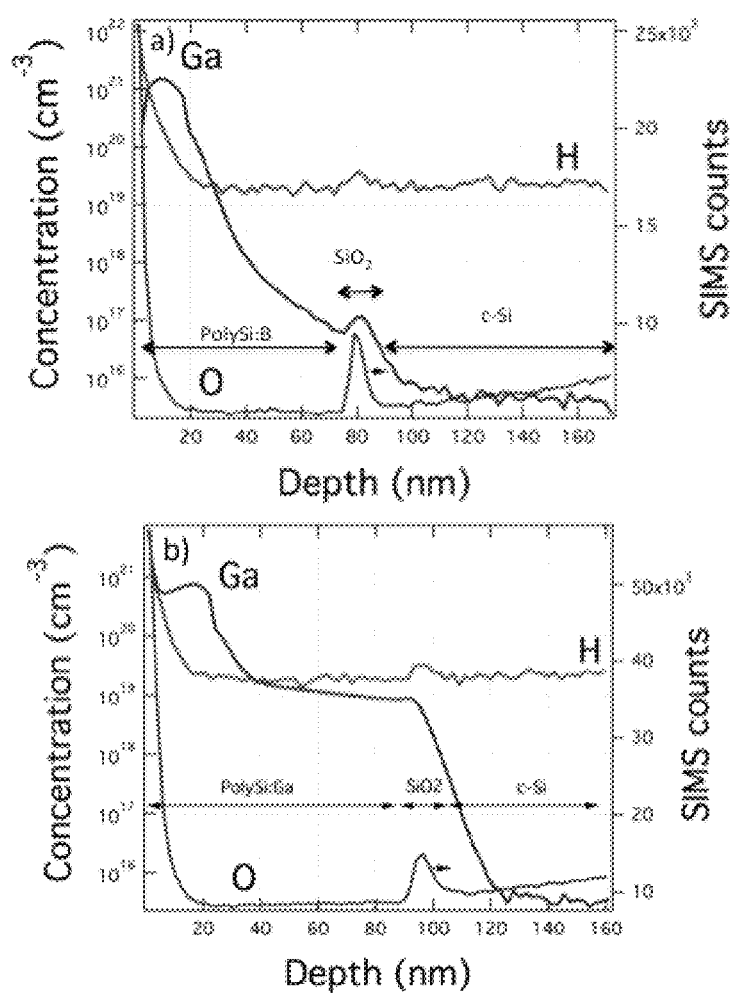
FIGS. 7a and 7b depicts SIMS depth profiles for Ga implanted polySi:Ga/SiO$_2$ passivated contacts in FIG. 2a) as implanted state, and FIG. 2b) after an 850° C., 30 min anneal. Note the lack of Ga and H buildup in the thin SiO$_2$ layer in contrast to the B-doped sample of FIG. 1.
Figure 8:
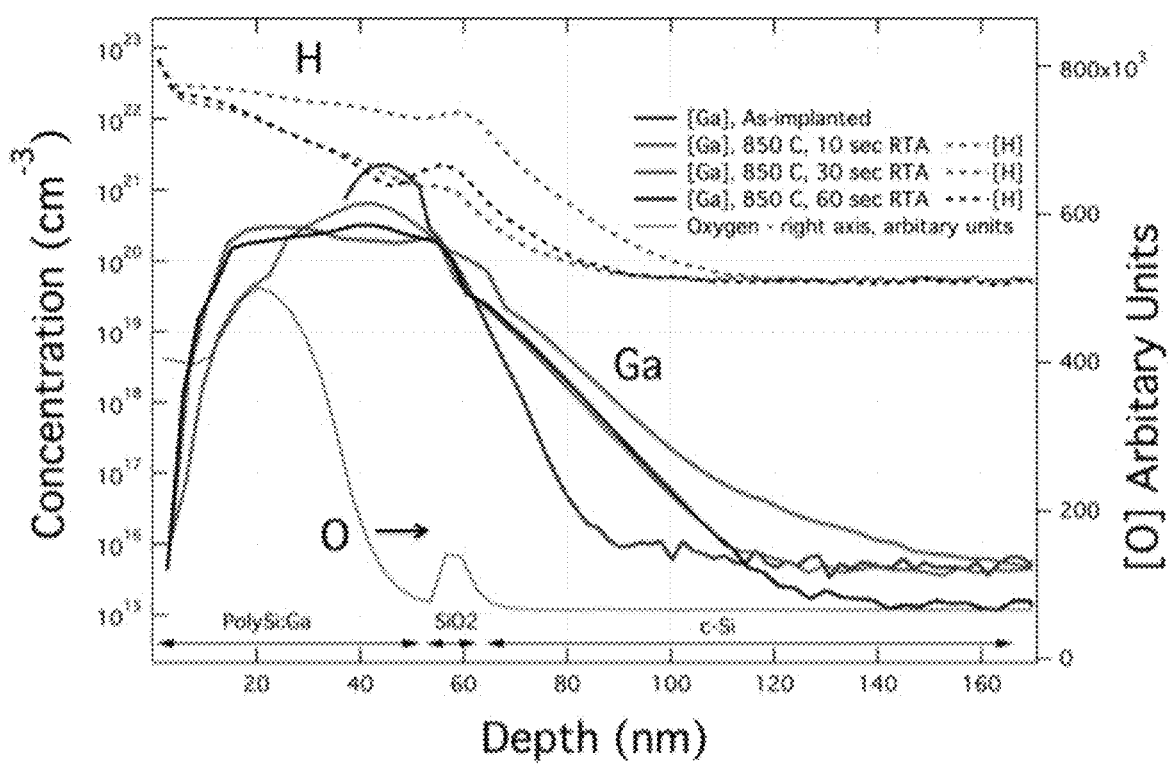
FIG. 8 depicts SIMS depth profile data of Ga, H and O for a series of Ga implanted samples as implanted and post anneal at 850° C. for 10, 30 and 60 s.

As with B- and P-doped polySi/$SiO_2$ contacts, annealing conditions play a significant role in the final dopant profiles, activation, and ultimately their passivation quality by improving the $SiO_2$/c-Si chemical passivation. As depicted in Table 1, a variety of annealing conditions for the Ga-doped passivated contacts were tried. For B- and P-doped samples we have found that an 850° C., 30 min anneal in either $N_2$ or forming gas (10% H, 90% $N_2$) forms an improved passivating contact for our deposition conditions. The SIMS depth profile of FIG. 6 for a polySi:B/$SiO_2$ contact was annealed under these conditions. This annealing protocol also worked for Ga-doped samples for a variety of implant conditions giving $iV_{oc}$ values between 720-731 mV. FIGS. 7a and 7b depict typical SIMS depth profiles for Ga, H, and O for Ga-doped samples before and after annealing at 850° C., for 30 min. The Ga profile exhibits retro and non-retrograde diffusion. The Ga does not pileup in the $SiO_2$ layer as is seen with B-doped polySi/$SiO_2$ contacts (compare with FIG. 6). The uniform doping in the polySi is consistent with the solid solubility limit of Ga in Si (of about 2E19 $cm^{-3}$). The H profile after the anneal is at about background levels in the polySi layer and does not pileup at the $SiO_2$ layer when compared to the B-doped contact (see FIG. 6). The retrograde diffusion of Ga out of the polySi during annealing resulted in about a 16% loss of Ga in the contact for sample Ga4_2. Given the dopant loss and the high contact resistivity (see below) to the sample, rapid thermal anneal (RTA) temperature-time profiles we performed to retain more Ga in the polySi and to achieve a higher percentage of Ga activation. FIG. 8 depicts the SIMS profiles for three samples annealed at 850° C. for 10, 30 and 60 sec after a three hour H-effusion anneal at 550° C. Without the latter anneal, the H would likely have rapidly effused and blistered the polySi during the 850° C. RTA anneal. The data of FIG. 8 show that the Ga diffuses into the c-Si wafer and uniformly distributes itself in the polySi for all annealing times. The Ga concentration rapidly decreases near the surface (<15 nm) of the polySi. The low $iV_{oc}$ values of less than 665 mV (see Table 1) for all of the samples reveal that the RTA anneals at about 850° C. and may not have provided enough thermal energy or time to either activate the Ga or to heal grown-in defects at the $SiO_2$/c-Si interface. These samples had noticeably lower bulk lifetimes (<200 μs) compared with other samples. In an embodiment, the shorter time at 850° C. was not long enough to heal passivation-killing defects or to getter impurities from the bulk to the polySi layer. Poor electrical contact between metal and the polySi:Ga for these samples was observed.

Next, we increased the temperature of the RTA to 950° C. to raise the thermal energy for dopant activation, but minimize retrograde Ga diffusion, and effusion from the contact. Davies observed enhanced activation of Ga implanted in Si by annealing above 950° C. for less than 25 sec. His data reveal that the Ga solubility limit in Si can be exceeded if the RTA time is less than about 4 seconds.

Figure 9:
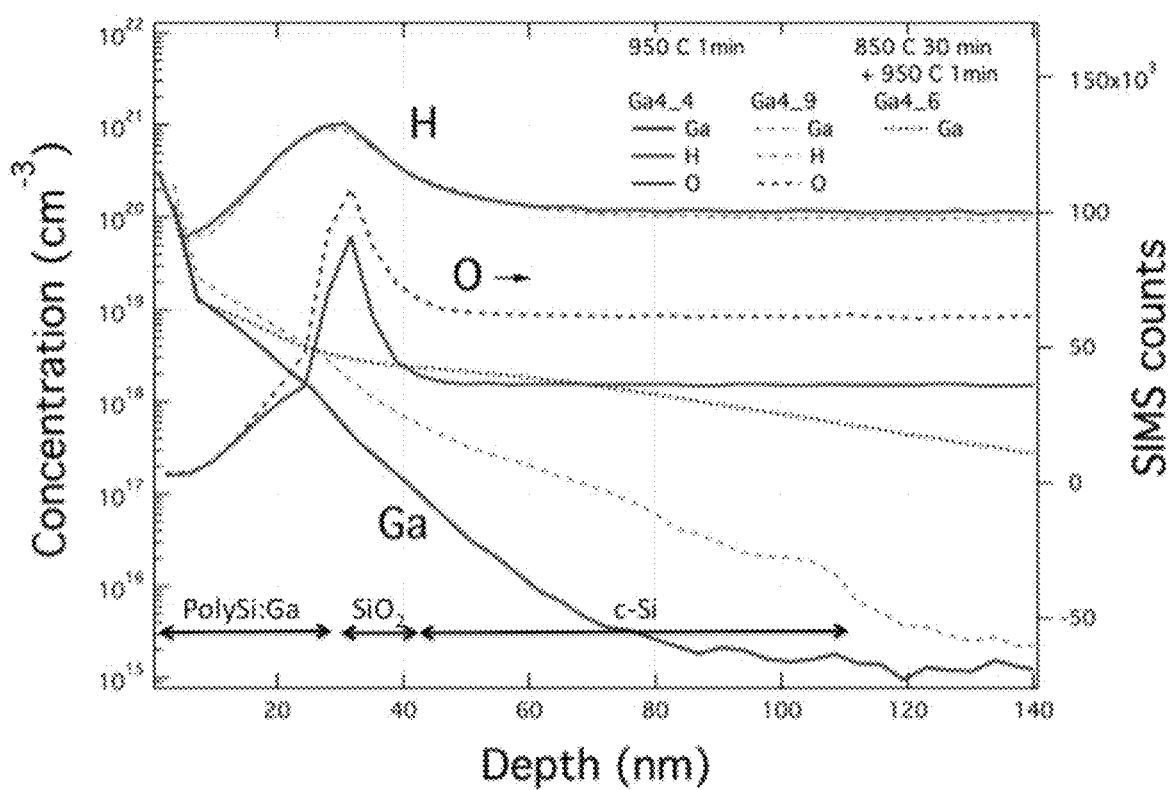
FIG. 9 depicts SIMS depth profiles for Ga, H and O for two samples annealed at 950° C. for 1 min, and one sample annealed at 850° C. for 30 min followed by 950° C. for 1 min.

FIG. 9 depicts SIMS profiles for two samples annealed at 950° C. for 60 sec. The Ga diffuses deep into the c-Si wafer and retrogrades towards the surface. The passivation quality of these films improved over the 850° C. RTA anneal reaching values of around 715 mV while maintaining high lifetimes in the wafer (see Table 1). The third sample profile shown in FIG. 9 is for an anneal of 850° C. for 30 min, followed by an RTA at 950° C. for 60 sec. This profile shows deep diffusion into the c-Si wafer, which may account for the increased $iV_{oc}$ value of 721 mV.

Metallization

Figure 10:
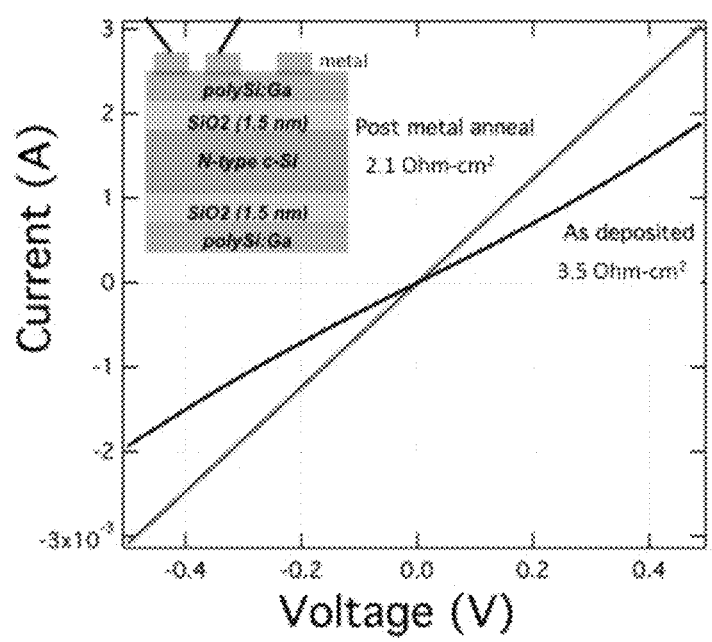
FIG. 10 depicts current-voltage data for Al:Si-polySi:Ga in the as deposited state and post metal anneal of 200° C. for 5 min. Note the improved Ohmic nature of the curve and the decrease in resistance.

Metal contacts were formed to the samples by etching off the $Al_2O_3$ in 1% HF and evaporating Ag or Al: Si (1% Si) in a TLM or small dot pattern through a shadow mask. Quantitative photoluminescence data showed about a 2-3 mV decrease in $iV_{oc}$ after metallization, better than similar B-doped samples. Current-voltage data between TLM pads (20-200 μm spacing) were generally Ohmic, but showed very high resistances (~100s-1000s Ohms) leading to large contact resistivities, or nonlinear resistance vs TLM pad spacing graphs. A 200° C., 5 min post metallization (Al: Si) anneal improved both the Ohmic nature and the resistance of the contact, as can be seen in FIG. 10. Only one sample in this study showed a linear TLM graph revealing a polySi: Ga/Al:Si contact resistivity of 95 mOhm-cm². This is an improved value for some back-contacted solar cells. Without being bound by theory, the high contact resistances may be explained by an etch-resistant oxide that forms on the surface of the polySi:Ga during annealing; and/or that the Ga dopants are either depleted at the surface of the sample, or they are not activated.

Figures 11A, 11B:
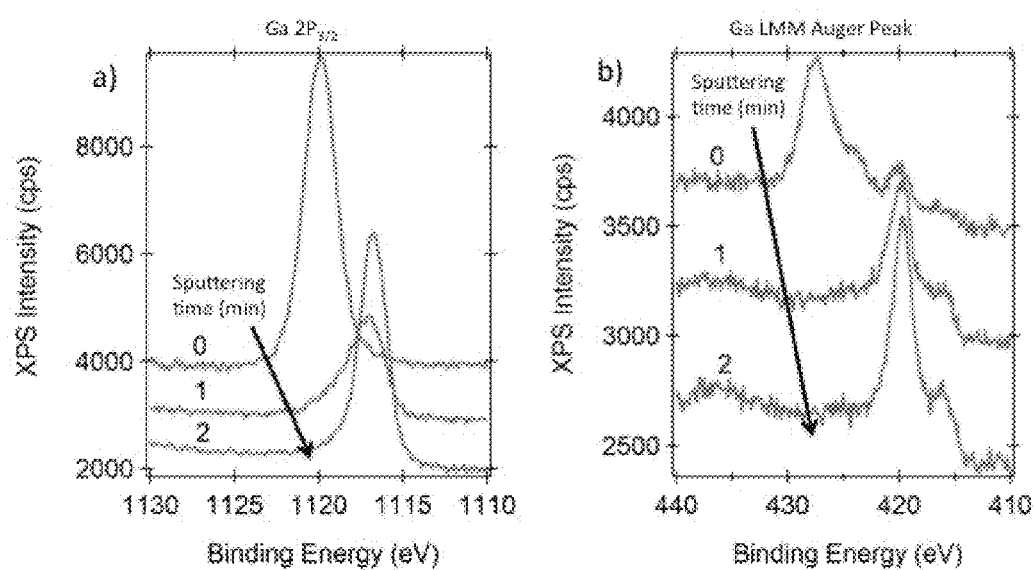
FIGS. 11a and 11b depict XPS depth profile data for a Ga-implanted polySi/SiO$_2$ contact showing a) the Ga 2P3/2 peak and b) the Ga LMM Auger peak as a function of sputtering time in min.

Gallium oxide is known to form and become etch resistant at temperatures over 800° C. when Ga and O are present in a material matrix. In an embodiment, O could have been present in the form of a Si native oxide on the surface of the samples during annealing, or O could have been present in trace amounts in the ambient of the furnace. XPS depth profile measurements were conducted to determine the chemical nature of the surface of the contacts. FIG. 11a depicts Ga 2p3/2 spectra taken from depth profile data with sputtering time in minutes labeled for each trace. The data display a dip in Ga 2p3/2 signal as well as a change in peak position with increased sputtering time. The Ga LMM Auger peak also shifts (FIG. 11b), and the Auger parameter changes from its initial value of 2179 eV, typical for $Ga_2O_3$, to about 2184 eV, closer to what is expected for reduced forms of gallium (e.g. gallium metal). Extreme oxide etching solutions (high concentrations of HCl and HF) did not improve the contact resistance.

More Ga was activated by raising the annealing temperature from 850° C. to 950° C. For samples annealed at 950° C. improvement in the diode contact resistance was observed.

Figure 12:
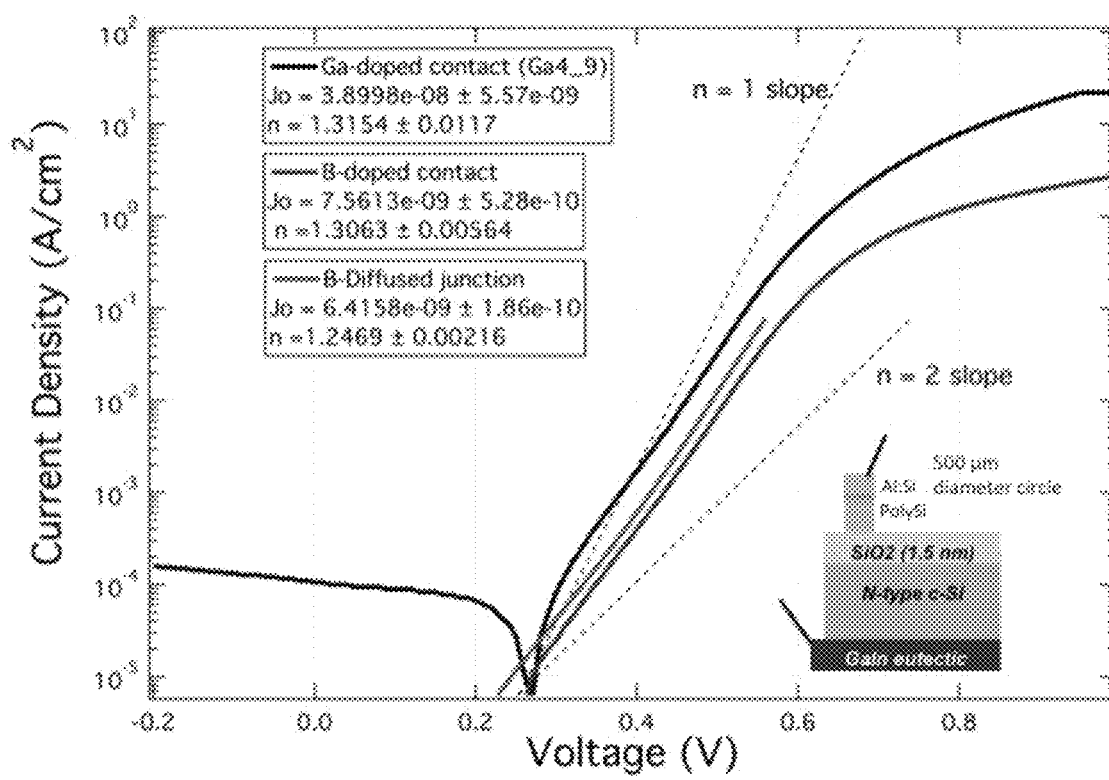
FIG. 12 depicts current density-voltage data for Ga-implanted sample Ga4_9 and an in situ B-doped sample showing similar diode fit parameters.

Metallized samples were reactive ion etched (RIE) in $SF_6$ between the small diameter (<500 μm) metallized circles to remove the polySi layer and isolate the metal/polySi/$SiO_2$ contacts. An Ohmic back contact was formed on the reverse side of the wafer, directly underneath the metallized dots, by removing the polySi:Ga layer with a full-area RIE and then applying a GaIn eutectic alloy. Current-voltage data were collected on the samples by contacting the metal dot on the front side and the GaIn eutectic on the rear side of the wafer. FIG. 12 depicts current density-voltage data under low-light conditions for sample Ga4_9. The data were fit with a simple diode equation to extract $J_o$=3.9E-9 A/cm² and a diode ideality value of 1.3. Despite reasonable diode qualities, a high series resistance is evident from the non-exponential rollover in high forward bias. The analysis revealed a very high contact resistivity of about 10 Ohm-cm². For comparison, FIG. 12 also depicts data for a polySi:B/$SiO_2$ contact under similar conditions. The diode ideality factors are the same, but the $J_o$ of the B-doped sample is 5× lower than for the Ga-doped sample. These data for p-type contacts formed under these process steps are useful for solar cell applications.

The ink-doped Ga samples resulted in higher $iV_{oc}$ values (see Table 1), however, none of the samples were able to be contacted with either Ag or Al: Si. SIMS, XPS and spreading resistance measurements indicate a depletion of Ga near the contacting surface.

The foregoing disclosure has been set forth merely to illustrate the invention and is not intended to be limiting.

We claim:

1. A method for fabricating gallium doped passivated contacts in a photovoltaic solar cell, the method comprising the steps of: providing a silicon substrate wherein the substrate is doped using ion implantation of gallium or spin-on dopant inks containing gallium; and wherein the doped substrate is annealed and passivated; wherein the annealing of the doped substrate comprises annealing at a temperature of about 950° C.; and wherein the passivated contacts have iVoc values of from about 710 to about 732 mV; and wherein the passivated contacts exhibit $J_{oe}$ values of from about 8.2 to about 3.0 fA/cm², and wherein the passivated contacts are passivated with $Al_2O_3$ and wherein the passivated contacts do not have pileup of gallium at a $SiO_2$ interface of the silicon substrate.

2. A photovoltaic solar cell comprising a silicon substrate comprising gallium doped passivated contacts wherein the passivated contacts have iVoc values of from about 710 to about 732 mV; and wherein the passivated contacts exhibit $J_{oe}$ values of from about 8.2 to about 3.0 fA/cm²; and wherein the passivated contacts do not have pileup of gallium at a $SiO_2$ interface of the silicon substrate; and wherein the passivated contacts have fewer dopant-related defects in the $SiO_2$ interface when compared to contacts made with a boron dopant; and wherein the passivated contacts are passivated with $Al_2O_3$, and wherein the solar cell exhibits efficiency greater than at least 20%.

3. The photovoltaic solar cell of claim 2 wherein the silicon substrate is a crystalline silicon.

4. The photovoltaic solar cell of claim 2 wherein the silicon substrate is an n-type doped silicon.

5. The photovoltaic solar cell of claim 2 wherein the silicon substrate is a p-type doped silicon.

6. The photovoltaic solar cell of claim 2 wherein the silicon substrate is a monocrystalline silicon.

7. The photovoltaic solar cell of claim 2 wherein the silicon substrate is a multicrystalline silicon.

* * * * *